US009691951B2

(12) United States Patent
Miyamoto

(10) Patent No.: US 9,691,951 B2
(45) Date of Patent: Jun. 27, 2017

(54) CURABLE SILICONE COMPOSITION, AND OPTICAL SEMICONDUCTOR DEVICE

(71) Applicant: Dow Corning Toray Co., Ltd., Toyko (JP)

(72) Inventor: Yusuke Miyamoto, Fuchu (JP)

(73) Assignee: DOW CORNING TORAY CO., LTD., Chiyoda-Ku, Tokyo (JP)

( * ) Notice: Subject to any disclaimer, the term of this patent is extended or adjusted under 35 U.S.C. 154(b) by 0 days.

(21) Appl. No.: 15/029,910

(22) PCT Filed: Oct. 8, 2014

(86) PCT No.: PCT/JP2014/077482
§ 371 (c)(1),
(2) Date: Apr. 15, 2016

(87) PCT Pub. No.: WO2015/056726
PCT Pub. Date: Apr. 23, 2015

(65) Prior Publication Data
US 2016/0233395 A1    Aug. 11, 2016

(30) Foreign Application Priority Data
Oct. 17, 2013 (JP) .................................. 2013-216854

(51) Int. Cl.
*H01L 33/00* (2010.01)
*H01L 33/56* (2010.01)
(Continued)

(52) U.S. Cl.
CPC .............. *H01L 33/56* (2013.01); *C08G 77/08* (2013.01); *C08G 77/44* (2013.01); *C08K 3/26* (2013.01);
(Continued)

(58) Field of Classification Search
CPC .......... H01L 33/40; H01L 33/56; H01L 33/54; H01L 33/62; C08G 77/12; C08G 77/08;
(Continued)

(56) References Cited

U.S. PATENT DOCUMENTS 5,292,586 A * 3/1994 Lin ........................ C09J 183/04
428/355 R
6,146,701 A 11/2000 Ferrier
(Continued)

FOREIGN PATENT DOCUMENTS

CN     101047220 A    10/2007
CN     103221485 A     7/2013
(Continued)

OTHER PUBLICATIONS

International Search Report for Application No. PCT/JP1014/077482 dated Jan. 6, 2015, 4 pages.
(Continued)

*Primary Examiner* — Brook Kebede
(74) *Attorney, Agent, or Firm* — Howard & Howard Attorneys PLLC

(57) ABSTRACT

The present invention provides a hydrosilylation curable silicone composition for forming a cured product which inhibits the discoloration of silver electrodes or a silver-plated substrate in an optical semiconductor device due to a sulfur-containing gas in the air, and for sealing, covering, or adhering an optical semiconductor element, the curable silicone composition comprising: (A) an organopolysiloxane having at least two silicon-bonded alkenyl groups per molecule; (B) an organohydrogenpolysiloxane having at least two silicon-bonded hydrogen atoms per molecule; (C) a tetrazole-based compound; and (D) a hydrosilylation reaction catalyst. In addition, the present invention provides an optical semiconductor device in which an optical semicon-
(Continued)

ductor element is sealed, covered, or adhered by the cured product of the composition so that the discoloration of silver electrodes or a silver-plated substrate due to a sulfur-containing gas in the air is inhibited.

14 Claims, 1 Drawing Sheet

(51) Int. Cl.
| | |
|---|---|
| C08K 5/3472 | (2006.01) |
| C08L 83/04 | (2006.01) |
| C08L 83/14 | (2006.01) |
| C08G 77/08 | (2006.01) |
| C08G 77/44 | (2006.01) |
| C08K 3/26 | (2006.01) |
| C08L 83/10 | (2006.01) |
| H01L 33/54 | (2010.01) |
| H01L 33/62 | (2010.01) |
| C08G 77/12 | (2006.01) |
| C08G 77/20 | (2006.01) |

(52) U.S. Cl.
CPC ............ C08K 5/3472 (2013.01); C08L 83/04 (2013.01); C08L 83/10 (2013.01); C08L 83/14 (2013.01); H01L 33/54 (2013.01); H01L 33/62 (2013.01); C08G 77/12 (2013.01); C08G 77/20 (2013.01); C08G 2190/00 (2013.01); C08L 2203/206 (2013.01); C08L 2205/02 (2013.01); H01L 2224/48091 (2013.01); H01L 2224/48247 (2013.01); H01L 2924/181 (2013.01)

(58) Field of Classification Search
CPC ...... C08G 77/44; C08G 77/20; C09D 7/1233; C09D 183/04; C08L 83/04; C08L 83/14; C08L 83/10
USPC .................................................. 257/98–100
See application file for complete search history.

(56) References Cited

U.S. PATENT DOCUMENTS

| | | | | |
|---|---|---|---|---|
| 7,329,706 | B2* | 2/2008 | Fukui | C08L 83/04 524/588 |
| 2001/0034403 | A1* | 10/2001 | Takuman | C08K 5/5419 524/588 |
| 2002/0010245 | A1* | 1/2002 | Enami | C08K 9/06 524/430 |
| 2006/0270808 | A1 | 11/2006 | Imazawa et al. | |
| 2007/0228391 | A1 | 10/2007 | Minami et al. | |

FOREIGN PATENT DOCUMENTS

| | | |
|---|---|---|
| DE | 600 00 696 T2 | 7/2003 |
| EP | 1 020 503 A1 | 7/2000 |
| ES | 2 186 613 T3 | 5/2003 |
| JP | H 11-29709 A | 2/1999 |
| JP | 2000-198930 A | 7/2000 |
| JP | 2000-234084 A | 8/2000 |
| JP | 2007-002233 A | 1/2007 |
| JP | 2007-266343 A | 10/2007 |
| JP | 2010-248413 A | 11/2010 |
| JP | 2011-228589 A | 11/2011 |
| JP | 2014-156577 A | 8/2014 |
| KR | 2013-0070653 A | 6/2013 |
| TW | 577914 B | 3/2004 |
| WO | WO 2012-067153 A1 | 5/2012 |

OTHER PUBLICATIONS

English language abstract for CN 101047220 extracted from espacenet.com database on Apr. 27, 2016, 2 pages.
English language abstract and machine-assisted English translation for CN 103221485 extracted from espacenet.com database on Apr. 27, 2016, 59 pages.
English language abstract for DE 600 00 696 extracted from espacenet.com database on Apr. 27, 2016, 1 page.
English language abstract for ES 2 186 613 extracted from espacenet.com database on Apr. 27, 2016, 1 page.
English language abstract and machine-assisted English translation for JPH 11-29709 extracted from espacenet.com database on Apr. 27, 2016, 19 pages.
English language abstract and machine-assisted English translation for JP 2000-198930 extracted from espacenet.com database on Apr. 27, 2016, 18 pages.
English language abstract for JP 2000-234084 extracted from espacenet.com database on Apr. 27, 2016, 1 page.
English language abstract for JP 2007-002233 extracted from espacenet.com database on Apr. 27, 2016, 1 page.
English language abstract for JP 2007-266343 extracted from espacenet.com database on Apr. 27, 2016, 2 pages.
English language abstract and machine-assisted English translation for JP 2010-248413 extracted from espacenet.com database on Apr. 27, 2016, 19 pages.
English language abstract and machine-assisted English translation for JP 2011-228589 extracted from espacenet.com database on Apr. 27, 2016, 26 pages.
English language abstract and machine-assisted English translation for JP 2014-156577 extracted from espacenet.com database on Apr. 27, 2016, 79 pages.
English language abstract and machine-assisted English translation for KR 2013-0070653 extracted from espacenet.com database on Apr. 27, 2016, 187 pages.
English language abstract for TW 577914 extracted from espacenet.com database on Apr. 27, 2016, 1 page.
English language abstract and machine-assisted English translation (of equivalent CN 103221485) for WO 2012-067153 extracted from espacenet.com database on Apr. 27, 2016, 59 pages.

* cited by examiner

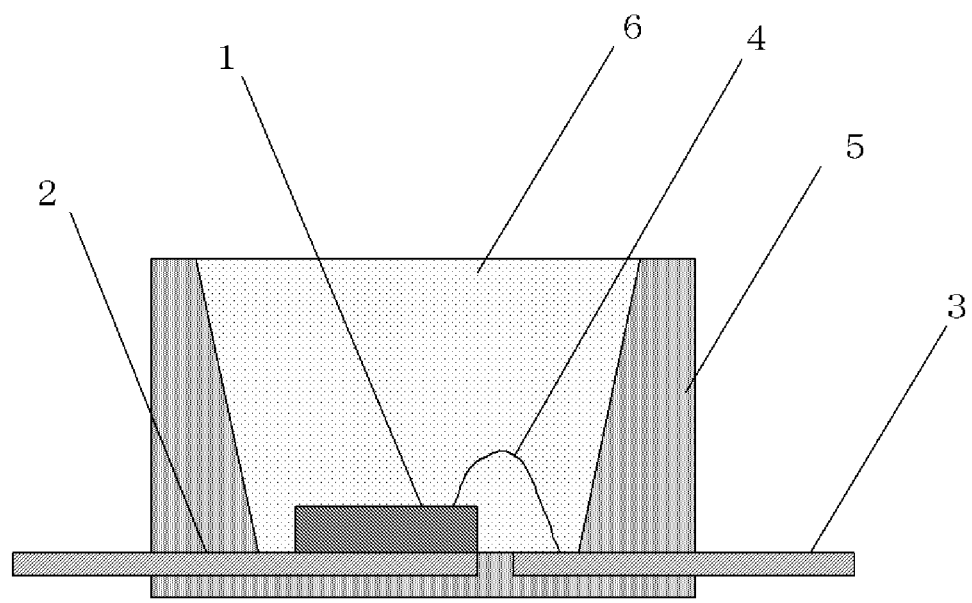

CURABLE SILICONE COMPOSITION, AND OPTICAL SEMICONDUCTOR DEVICE

CROSS-REFERENCE TO RELATED APPLICATIONS

This application is the National Stage of International Patent Application No. PCT/JP2014/077482, filed on Oct. 8, 2014, which claims priority to and all the advantages of Japanese Patent Application No. 2013-216854, filed on Oct. 17, 2013, the content of which is incorporated herein by reference.

TECHNICAL FIELD

The present invention relates to a curable silicone composition and an optical semiconductor device using the composition.

BACKGROUND ART

Curable silicone compositions which are cured by a hydrosilylation reaction are used to seal, cover, or adhere optical semiconductor elements in optical semiconductor devices. A curable silicone composition comprising a diorganopolysiloxane having at least two silicon-bonded alkenyl groups per molecule, an organopolysiloxane with a resin structure having a vinyl group, an organohydrogenpolysiloxane having at least two silicon-bonded hydrogen atoms per molecule, and a platinum metal-type catalyst is proposed in Japanese Unexamined Patent Application Publication No. 2000-198930A as such a curable silicone composition.

However, such a curable silicone composition has a problem in that it cannot sufficiently inhibit the discoloration of silver electrodes or a silver-plated substrate in the optical semiconductor device due to a sulfur-containing gas such as hydrogen sulfide in the air.

A curable silicone composition which contains a tetrazole compound having at least one type of functional group selected from the group consisting of amino groups, amide groups, carbonyl groups, carboxyl groups, and thiol groups in order to impart a silicone cured product with flame retardance is proposed in Japanese Unexamined Patent Application Publication No. H11-29709A, and a hydrosilylation reaction is also disclosed as the curing mechanism thereof.

However, although it is described in Japanese Unexamined Patent Application Publication No. H11-29709 that such a curable silicone composition can be used in electrical or electronic parts, there was no suggestion of an application for sealing, covering, or adhering an optical semiconductor element.

PRIOR ART DOCUMENTS

Patent Documents

Patent Document 1: Japanese Unexamined Patent Application Publication No. 2000-198930A
Patent Document 2: Japanese Unexamined Patent Application Publication No. H11-29709A

SUMMARY OF INVENTION

Technical Problem

An object of the present invention is to provide a curable silicone composition for forming a cured product which inhibits the discoloration of silver electrodes or a silver-plated substrate in an optical semiconductor device due to a sulfur-containing gas in the air. In addition, another object of the present invention is to provide an optical semiconductor device in which the discoloration of silver electrodes or a silver-plated substrate due to a sulfur-containing gas in the air is inhibited.

Solution to Problem

The curable silicone composition of the present invention is a hydrosilylation curable silicone composition for sealing, covering, or adhering an optical semiconductor element, the curable silicone composition comprising:
(A) an organopolysiloxane having at least two silicon-bonded alkenyl groups per molecule;
(B) an organohydrogenpolysiloxane having at least two silicon-bonded hydrogen atoms per molecule, in an amount such that an amount of silicon-bonded hydrogen atoms in this component being from 0.1 to 10 mol per 1 mol of silicon-bonded alkenyl groups in component (A);
(C) a tetrazole-based compound, in an amount of from 1 ppm to 0.5% with respect to the present composition in terms of mass units; and
(D) a hydrosilylation reaction catalyst, in an amount which accelerates the curing of the present composition.

Component (A) described above is preferably (A-1) a straight-chain organopolysiloxane represented by the general formula:

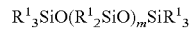

$R^1_3SiO(R^1_2SiO)_m SiR^1_3$ wherein $R^1$ are the same or different monovalent hydrocarbon groups; however, at least two $R^1$ in each molecule are alkenyl groups; and m is an integer of from 5 to 1,000;
and/or (A-2) a branched-chain organopolysiloxane represented by the average unit formula:

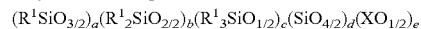

$(R^1SiO_{3/2})_a(R^1_2SiO_{2/2})_b(R^1_3SiO_{1/2})_c(SiO_{4/2})_d(XO_{1/2})_e$ wherein $R^1$ are the same as defined above; however, from 0.01 to 50 mol % of the total of $R^1$ are alkenyl groups; X is a hydrogen atom or an alkyl group; and "a", "b", "c", "d", and "e" are numbers satisfying: $0 \le a \le 1.0$, $0 \le b \le 1.0$, $0 \le c < 0.9$, $0 \le d < 0.5$, $0 \le e < 0.4$, and $a+b+c+d=1.0$.

Component (C) described above is preferably at least one type of a tetrazole-based compound selected from the group consisting of 1H-tetrazole, 1H-tetrazole-1-acetic acid, 1H-tetrazole-5-acetic acid, 1H-tetrazole-1-ethyl acetate, 1H-tetrazole-5-ethyl acetate, 1-methyl-1H-tetrazole, 1-ethyl-1H-tetrazole, 1-propyl-1H-tetrazole, 1-butyl-1H-tetrazole, 1-pentyl-1H-tetrazole, 1-phenyl-1H-tetrazole, 1,5-dimethyl-1H-tetrazole, 1-ethyl-5-methyl-1H-tetrazole, 1-phenyl-5-methyl-1H-tetrazole, 1-methyl-5-ethyl-1H-tetrazole, 1-methyl-5-phenyl-1H-tetrazole, 1-ethyl-5-phenyltetrazole, 1,5-diphenyl-1H-tetrazole, 1,5-trimethylene-1H-tetrazole, 1,5-tetramethylene-1H-tetrazole, 1,5-pentamethylene-1H-tetrazole, 5-methyl-1H-tetrazole, 5-ethyl-1H-tetrazole, 5-phenyl-1H-tetrazole, 5-benzyl-1H-tetrazole, 5-methoxy-1H-tetrazole, and 2H-tetrazole-2-acetic acid.

The optical semiconductor device of the present invention is characterized in that an optical semiconductor element is sealed, covered or adhered with a cured product of the curable silicone composition described above, and the optical semiconductor element is preferably a light-emitting diode.

Advantageous Effects of Invention

The curable silicone composition of the present invention is characterized in that it forms a cured product which inhibits the discoloration of silver electrodes or a silver-plated substrate in an optical semiconductor device due to a sulfur-containing gas in the air. In addition, the optical semiconductor device of the present invention is characterized in that the discoloration of silver electrodes or a silver-plated substrate due to a sulfur-containing gas in the air is inhibited.

BRIEF DESCRIPTION OF THE DRAWING

FIG. 1 is a cross-sectional view of an LED that is an example of an optical semiconductor device of the present invention.

DESCRIPTION OF EMBODIMENTS

First, the curable silicone composition of the present invention will be described in detail.

Component (A) is a base compound of the present composition and is an organopolysiloxane having at least two silicon-bonded alkenyl groups per molecule. Examples of the alkenyl groups include alkenyl groups having from 2 to 12 carbon atoms such as vinyl groups, allyl groups, butenyl groups, pentenyl groups, hexenyl groups, heptenyl groups, octenyl groups, nonenyl groups, decenyl groups, undecenyl groups, and dodecenyl groups, with vinyl groups being preferable. In addition, examples of groups bonding to silicon atoms other than alkenyl groups in component (A) include alkyl groups having from 1 to 12 carbon atoms such as methyl groups, ethyl groups, propyl groups, isopropyl groups, butyl groups, isobutyl groups, tert-butyl groups, pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbon atoms such as phenyl groups, tolyl groups, xylyl groups, and naphthyl groups; aralkyl groups having from 7 to 20 carbon atoms such as benzyl groups, phenethyl groups, and phenylpropyl groups; and groups in which some or all of the hydrogen atoms of these groups are substituted with halogen atoms such as fluorine atoms, chlorine atoms, or bromine atoms. Furthermore, the silicon atoms in component (A) may have small amounts of hydroxyl groups or alkoxy groups such as methoxy groups or ethoxy groups within a range that does not impair the object of the present invention.

Examples of the molecular structure of component (A) include a straight-chain structure, a partially branched straight-chain structure, a branched-chain structure, a cyclic structure, and a three-dimensional reticular structure. Component (A) may be one type of organopolysiloxane having these molecular structures or may be a mixture of two or more types of organopolysiloxanes having these molecular structures.

Such component (A) is preferably (A-1) a straight-chain organopolysiloxane represented by the general formula:

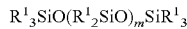

and/or (A-2) a branched-chain organopolysiloxane represented by the average unit formula:

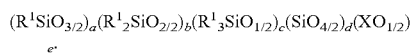

In component (A-1), $R^1$ in the formula are the same or different monovalent hydrocarbon groups, examples of which include the same alkyl groups, alkenyl groups, aryl groups, and aralkyl groups as those described above and groups in which some or all of the hydrogen atoms of these groups are substituted with halogen atoms such as fluorine atoms, chlorine atoms, or bromine atoms. However, at least two $R^1$ in each molecule are alkenyl groups. In addition, in the formula, "m" is an integer from 5 to 1,000, preferably an integer from 50 to 1,000 or an integer from 100 to 1,000.

Examples of such component (A-1) include dimethylpolysiloxanes capped at both molecular terminals with dimethylvinylsiloxy groups, dimethylsiloxane-methylvinylsiloxane copolymers capped at both molecular terminals with dimethylvinylsiloxy groups, dimethylsiloxane-methylphenylsiloxane copolymers capped at both molecular terminals with dimethylvinylsiloxy groups, methylphenylpolysiloxanes capped at both molecular terminals with dimethylvinylsiloxy groups, dimethylsiloxane-methylvinylsiloxane copolymers capped at both molecular terminals with trimethylsiloxy groups, dimethylsiloxane-methylvinylsiloxane-methylphenylsiloxane copolymers capped at both molecular terminals with trimethylsiloxy groups, and mixtures of two or more types thereof.

In addition, in component (A-2), $R^1$ in the formula are the same or different monovalent hydrocarbon groups, examples of which include the same alkyl groups, alkenyl groups, aryl groups, and aralkyl groups as those described above and groups in which some or all of the hydrogen atoms of these groups are substituted with halogen atoms such as fluorine atoms, chlorine atoms, or bromine atoms. However, from 0.01 to 50 mol %, from 0.05 to 40 mol %, or from 0.09 to 32 mol % of the total amount of $R^1$ are preferably alkenyl groups. This is because when the ratio of alkenyl groups is greater than or equal to the lower limit of the aforementioned range, the curability of the obtained cured product is good, whereas when the ratio of alkenyl groups is less than or equal to the upper limit of the aforementioned range, the mechanical characteristics of the obtained cured product are good. Here, the content of the alkenyl groups can be determined by analytical methods such as a Fourier transform infrared spectrophotometer (FT-IR), nuclear magnetic resonance (NMR), or gel permeation chromatography (GPC), for example.

In addition, in the formula, X is a hydrogen atom or an alkyl group. Examples of the alkyl group include alkyl groups having from 1 to 12 carbon atoms such as methyl groups, ethyl groups, propyl groups, isopropyl groups, butyl groups, isobutyl groups, tert-butyl groups, pentyl groups, neopentyl groups, hexyl groups, cyclohexyl groups, heptyl groups, octyl groups, nonyl groups, decyl groups, undecyl groups, and dodecyl groups, and alkyl groups having from 1 to 3 carbon atoms are preferable.

In addition, in the formula, "a" is a number which indicates the ratio of siloxane units represented by the formula: $R^1SiO_{3/2}$ and satisfies $0 \leq a \leq 1.0$; "b" is a number which indicates the ratio of siloxane units represented by the formula: $R^1_2SiO_{2/2}$ and satisfies $0 \leq b \leq 1.0$; "c" is a number which indicates the ratio of siloxane units represented by the formula: $R^1_3SiO_{1/2}$ and satisfies $0 \leq c < 0.9$; and "d" is a number which indicates the ratio of siloxane units represented by the formula: $SiO_{4/2}$ and satisfies $0 \leq d < 0.5$. However, in the formula, a+b+c+d=1.0. In addition, "e" is a number which indicates the ratio of hydroxyl groups or alkoxy groups bonded to silicon atoms and satisfies $0 \leq e < 0.4$.

Component (A-1) alone, component (A-2) alone, or a mixture of component (A-1) and component (A-2) may be used as component (A). When a mixture of component (A-1) and component (A-2) is used, the content of component (A-2) is preferably at most 90 mass % or at most 60 mass % of the total amount of component (A-1) and component (A-2) in that the handleability of the obtained composition is good. In addition, the content of component (A-2) is preferably at least 10 mass % of the total amount of component (A-1) and component (A-2) in that the mechanical characteristics of the obtained cured product are good.

Component (A) is a liquid or a solid at 25° C. If component (A) is a liquid at 25° C., the viscosity of the liquid at 25° C. is preferably in the range of from 1 to 1,000,000 mPa·s or in the range of from 10 to 1,000,000 mPa·s. This viscosity may, for example, be determined by measurement using a B-type viscometer in accordance with JIS K 7117-1.

Component (B) is a crosslinking agent of the present composition and is an organohydrogenpolysiloxane having at least two silicon-bonded hydrogen atoms per molecule. Examples of groups bonding to silicon atoms other than hydrogen atoms in component (B) include alkyl groups having from 1 to 12 carbon atoms such as methyl groups, ethyl groups, propyl groups, isopropyl groups, butyl groups, isobutyl groups, tert-butyl groups, pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbon atoms such as phenyl groups, tolyl groups, xylyl groups, and naphthyl groups; aralkyl groups having from 7 to 20 carbon atoms such as benzyl groups, phenethyl groups, and phenylpropyl groups; and groups in which some or all of the hydrogen atoms of these groups are substituted with halogen atoms such as fluorine atoms, chlorine atoms, or bromine atoms. Furthermore, the silicon atoms in component (B) may have small amounts of hydroxyl groups or alkoxy groups such as methoxy groups or ethoxy groups within a range that does not impair the object of the present invention.

Examples of the molecular structure of component (B) include straight-chain, partially branched straight-chain, branched chain, cyclic, and three-dimensional reticular structures, and the molecular structure is preferably a partially branched straight-chain, branched chain, or three-dimensional reticular structure.

Component (B) is a solid or a liquid at 25° C. If component (B) is a liquid at 25° C., the viscosity of the liquid at 25° C. is preferably at most 10,000 mPa·s, in the range of from 0.1 to 5,000 mPa·s, or in the range of from 0.5 to 1,000 mPa·s. This viscosity may, for example, be determined by measurement using a B-type viscometer in accordance with JIS K 7117-1.

Examples of such component (B) include 1,1,3,3-tetramethyldisiloxane, 1,3,5,7-tetramethylcyclotetrasiloxane, tris (dimethylhydrogensiloxy)methylsilane, tris(dimethylhydrogensiloxy)phenylsilane, 1-glycidoxypropyl-1,3,5,7-tetramethylcyclotetrasiloxane, 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, methylhydrogenpolysiloxanes capped at both molecular terminals with trimethylsiloxy groups, dimethylsiloxane-methylhydrogensiloxane copolymers capped at both molecular terminals with trimethylsiloxy groups, dimethylpolysiloxanes capped at both molecular terminals with dimethylhydrogensiloxy groups, dimethylsiloxane-methylhydrogensiloxane copolymers capped at both molecular terminals with dimethylhydrogensiloxy groups, methylhydrogensiloxane-diphenylsiloxane copolymers capped at both molecular terminals with trimethylsiloxy groups, methylhydrogensiloxane-diphenylsiloxane-dimethylsiloxane copolymers capped at both molecular terminals with trimethylsiloxy groups, copolymers consisting of $(CH_3)_2HSiO_{1/2}$ units and $SiO_{4/2}$ units, copolymers consisting of $(CH_3)_2HSiO_{1/2}$ units, $SiO_{4/2}$ units, and $(C_6H_5)SiO_{3/2}$ units, and mixtures of two or more types thereof.

The content of component (B) is an amount such that the content of silicon-bonded hydrogen atoms in this component is from 0.1 to 10 mol and preferably from 0.5 to 5 mol per 1 mol of silicon-bonded alkenyl groups in component (A). This is because when the content of component (B) is less than or equal to the upper limit of the aforementioned range, the mechanical characteristics of the obtained cured product are good, whereas when the content of component (B) is greater than or equal to the lower limit of the aforementioned range, the curability of the obtained composition is good. Here, the content of the silicon-bonded hydrogen atom in component (B) can be determined by analytical methods such as a Fourier transform infrared spectrophotometer (FT-IR), nuclear magnetic resonance (NMR), or gel permeation chromatography (GPC), for example.

Component (C) is a tetrazole-based compound for imparting sulfidation resistance to the cured product of the present composition. Component (C) is preferably a tetrazole-based compound not having functional groups such amino groups or thiol groups since such compounds are less likely to inhibit the curing of the present composition, and specific examples thereof include 1H-tetrazole, 1H-tetrazole-1-acetic acid, 1H-tetrazole-5-acetic acid, 1H-tetrazole-1-ethyl acetate, 1H-tetrazole-5-ethyl acetate, 1-methyl-1H-tetrazole, 1-ethyl-1H-tetrazole, 1-propyl-1H-tetrazole, 1-butyl-1H-tetrazole, 1-pentyl-1H-tetrazole, 1-phenyl-1H-tetrazole, 1,5-dimethyl-1H-tetrazole, 1-ethyl-5-methyl-1H-tetrazole, 1-phenyl-5-methyl-1H-tetrazole, 1-methyl-5-ethyl-1H-tetrazole, 1-methyl-5-phenyl-1H-tetrazole, 1-ethyl-5-phenyltetrazole, 1,5-diphenyl-1H-tetrazole, 1,5-trimethylene-1H-tetrazole, 1,5-tetramethylene-1H-tetrazole, 1,5-pentamethylene-1H-tetrazole, 5-methyl-1H-tetrazole, 5-ethyl-1H-tetrazole, 5-phenyl-1H-tetrazole, 5-benzyl-1H-tetrazole, 5-methoxy-1H-tetrazole, and 2H-tetrazole-2-acetic acid. One type or two or more types of such tetrazole-based compounds may be used in combination as component (C).

The content of component (C) is an amount in a range of from 1 ppm to 0.5% and preferably in a range of from 5 ppm to 0.3% or in a range of from 10 ppm to 0.1% in terms of mass units in the present composition. This is because when the content of component (C) is greater than or equal to the lower limit of the aforementioned range, sulfidation resistance can be sufficiently imparted, whereas when the content of component (C) is less than or equal to the upper limit of the aforementioned range, the curability of the obtained composition is not diminished, and the physical properties of the obtained cured product are not diminished.

Component (D) is a hydrosilylation catalyst used to accelerate curing of the present composition. Examples of component (D) include platinum group element catalysts and platinum group element compound catalysts, and specific examples include platinum-based catalysts, rhodium-based catalysts, palladium-based catalysts, and combinations of at least two types thereof. In particular, platinum-based catalysts are preferable in that the curing of the present composition can be dramatically accelerated. Examples of these platinum-based catalysts include finely powdered platinum; platinum black; chloroplatinic acid, alcohol-modified chloroplatinic acid; chloroplatinic acid/diolefin complexes; platinum/olefin complexes; platinum/carbonyl complexes such as platinum bis(acetoacetate), and platinum bis(acetylacetonate); chloroplatinic acid/alkenylsiloxane complexes such as chloroplatinic acid/divinyltetramethyl disiloxane complexes and chloroplatinic acid/tetravinyl tetramethyl cyclotetrasiloxane complexes; platinum/alkenylsiloxane complexes such as platinum/divinyltetramethyl disiloxane complexes and platinum/tetravinyl tetramethyl cyclotetrasiloxane complexes; complexes of chloroplatinic acid and acetylene alcohols; and mixtures of two or more types thereof. In particular, platinum-alkenylsiloxane complexes are preferable in that the curing of the present composition can be accelerated.

Examples of the alkenylsiloxane used in the platinum-alkenylsiloxane complex include 1,3-divinyl-1,1,3,3-tetramethyldisiloxane, 1,3,5,7-tetramethyl-1,3,5,7-tetravinylcyclotetrasiloxane, alkenylsiloxane oligomers in which some of the methyl groups of these alkenylsiloxanes are substituted with ethyl groups, phenyl groups, or the like, and alkenylsiloxane oligomers in which the vinyl groups of these alkenylsiloxanes are substituted with allyl groups, hexenyl groups, or the like. In particular, 1,3-divinyl-1,1,3,3-tetramethyldisiloxane is preferable in that the stability of the platinum-alkenylsiloxane complex that is produced is good.

In order to improve the stability of the platinum-alkenylsiloxane complexes, it is preferable to dissolve these platinum-alkenylsiloxane complexes in an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, or 1,3,5,7-tetramethyl-1,3,5,7-tetravinylcyclotetrasiloxane or an organosiloxane oligomer such as a dimethylsiloxane oligomer, and it is particularly preferable to dissolve the complexes in an alkenylsiloxane oligomer.

The content of component (D) is an amount that accelerates the curing of the present composition. Specifically, the content is preferably an amount such that the content of catalyst metal atoms in component (D) is in the range of from 0.01 to 500 ppm, in the range of from 0.01 to 100 ppm, or in the range of from 0.1 to 50 ppm in terms of mass units with respect to the present composition. This is because when the content of component (D) is greater than or equal to the lower limit of the aforementioned range, the curability of the obtained composition is good, whereas when the content of component (D) is less than or equal to the upper limit of the aforementioned range, the coloration of the obtained cured product is suppressed.

The present composition may contain (E) a hydrosilylation reaction suppressing agent in order to prolong the usable life at room temperature and to improve storage stability. Examples of component (E) include alkyne alcohols such as 1-ethynylcyclohexan-1-ol, 2-methyl-3-butyn-2-ol, 3,5-dimethyl-1-hexyn-3-ol, and 2-phenyl-3-butyn-2-ol; enyne compounds such as 3-methyl-3-penten-1-yne and 3,5-dimethyl-3-hexen-1-yne; methylalkenylsiloxane oligomers such as 1,3,5,7-tetramethyl-1,3,5,7-tetravinylcyclotetrasiloxane and 1,3,5,7-tetramethyl-1,3,5,7-tetrahexenylcyclotetrasiloxane; alkynoxysilanes such as dimethyl bis(3-methyl-1-butyn-3-oxy)silane and methylvinyl bis(3-methyl-1-butyn-3-oxy)silane, and triallylisocyanurate compounds.

The content of component (E) is not limited but is preferably in the range of from 0.0001 to 5 parts by mass or in the range of from 0.01 to 3 parts by mass per 100 parts by mass of the present composition.

The present composition may contain (F) zinc oxide or zinc carbonate in order to impart further sulfidation resistance to the obtained cured product. Component (F) is preferably at least one type of a fine powder having a mass average particle size of from 0.1 nm to 5 μm selected from the group consisting of zinc oxide fine powders surface-coated with an oxide and/or hydroxide of at least one type of element selected from the group consisting of Al, Ag, Cu, Fe, Sb, Si, Sn, Ti, Zr, and rare earth elements; zinc oxide fine powders surface-treated with organic silicon compounds not having alkenyl groups; and hydrate fine powders of zinc carbonate. Here, the mass average particle size can be measured by laser diffraction, scattering, or the like. The "mass average particle size" in the present invention refers to the particle size (D50) when the cumulative mass is 50%, which is obtained by measuring the particle size distribution.

In a zinc oxide fine powder surface-coated with an oxide, examples of rare earth elements include yttrium, cerium, and europium. Examples of oxides on the surface of zinc oxide fine powders include $Al_2O_3$, AgO, $Ag_2O$, $Ag_2O_3$, CuO, $Cu_2O$, FeO, $Fe_2O_3$, $Fe_3O_4$, $Sb_2O_3$, $SiO_2$, $SnO_2$, $Ti_2O_3$, $TiO_2$, $Ti_3O_5$, $ZrO_2$, $Y_2O_3$, $CeO_2$, $Eu_2O_3$, mixtures of two or more types of these oxides, and hydrates of oxides such as $Al_2O_3$-$nH_2O$, $Fe_2O_3$-$nH_2O$, $Fe_3O_4$-$nH_2O$, $Sb_2O_3$-$nH_2O$, $SiO_2$-$nH_2O$, $TiO_2$-$nH_2O$, $ZrO_2$-$nH_2O$, and $CeO_2$-$nH_2O$, and $Al_2O_3$ and $SiO_2$ are preferable. Here, "n" is ordinarily a positive integer, but "n" does not necessarily take the form of an integer depending on the degree of dehydration.

In a zinc oxide fine powder surface-coated with a hydroxide, examples of rare earth elements include yttrium, cerium, and europium. Examples of hydroxides on the surface of zinc oxide fine powders include $Al(OH)_3$, $Cu(OH)_2$, $Fe(OH)_3$, $Ti(OH)_4$, $Zr(OH)_3$, $Y(OH)_3$, $Ce(OH)_3$, $Ce(OH)_4$, mixtures of two or more types of these oxides, and hydroxides of oxides such as $Ce(OH)_3$-$nH_2O$, and $Al(OH)_3$ is preferable. Here, "n" is ordinarily a positive integer, but "n" does not necessarily take the form of an integer depending on the degree of dehydration.

In addition, zinc oxides surface-coated with the oxides described above may be further surface-coated with the hydroxides described above or may be further surface-coated with an oxide other than those described above. Furthermore, zinc oxides surface-coated with the hydroxides described above may be further surface-coated with the oxides described above or may be further surface-coated with a hydroxide other than those described above. In addition, component (F) may be a zinc oxide surface-coated with the oxides and hydroxides described above. Examples of combinations of oxides and hydroxides include a combination of $Al_2O_3$ and $Al(OH)_3$ and a combination of $SiO_2$ and $Al(OH)_3$.

In a zinc oxide fine powder surface-treated with an organic silicon compound, the organic silicon compound does not have alkenyl groups, and examples include organosilanes, organosilazanes, polymethylsiloxanes, organohydrogenpolysiloxanes, and organosiloxane oligomers. Specific examples include organochlorosilanes such as trimethylchlorosilane, dimethylchlorosilane, and methyltrichlorosilane; organotrialkoxysilanes such as methyltrimethoxysilane, methyltriethoxysilane, phenyltrimethoxysilane, ethyltrimethoxysilane, and n-propyltrimethoxysilane; diorganodialkoxysilanes such as dimethyldimethoxysilane, dimethyldiethoxysilane, and diphenyldimethoxysilane; triorganoalkoxysilanes such as trimethylmethoxysilane and trimethylethoxysilane; partial condensates of these organoalkoxysilanes; organosilazanes such as hexamethyldisilazane; a polymethylsiloxane, an organohydrogenpolysiloxane, an organosiloxane oligomer having a silanol group or an alkoxy group, and resin-like organopolysiloxanes consisting of an $R^8SiO_{3/2}$ unit (wherein $R^8$ is a monovalent hydrocarbon group excluding alkenyl groups, examples of which include alkyl groups such as methyl groups, ethyl groups, or propyl groups; and aryl groups such as phenyl groups) or an $SiO_{4/2}$ unit, and having a silanol group or an alkoxy group.

In addition, the zinc oxide fine powder described above may be subjected to further surface treatment. Examples include higher fatty acids such as stearic acid or metal soaps thereof, higher fatty acid esters such as octyl palmitate, trimethylolethane, trimethylolpropane, and polyhydric alcohols such as pentaerythritol, and amine compounds such as diethanolamine and triethanolamine. Furthermore, coupling agents such as alkyl titanate, alkyl aluminate, and alkyl zirconate or fluorine-based organic compounds such as perfluoroalkyl silane or perfluoroalkyl phosphoric acid esters may also be used.

A fine powder of a hydrate of zinc carbonate is a compound in which water bonds to zinc carbonate, and is preferably a compound in which the rate of mass decrease is at least 0.1 mass % under heating conditions at 105° C. for 3 hours.

The content of component (F) is preferably an amount in the range of from 0.0001 to 10% or an amount in the range of from 0.0001 to 5% in terms of mass units with respect to the present composition. This is because when the content of component (F) is greater than or equal to the lower limit of the range described above, the discoloration of the silver electrodes or the silver-plated substrate in the optical semiconductor device due to a sulfur-containing gas is sufficiently suppressed, and when the content is less than or equal to the upper limit of the range described above, the fluidity of the resulting composition is not diminished.

The present composition may contain (G) a metal-based condensation reaction catalyst in order to impart peeling resistance to the obtained cured product. Examples of component (G) include organic aluminum compounds, organic titanium compounds, organic zirconium compounds, organic magnesium compounds, organic zinc compounds, organic copper compounds, organic nickel compounds, organic chromium compounds, organic cobalt compounds, organic iron compounds, organic indium compounds, organic lanthanum compounds, organic tin compounds, organic hafnium compounds, and mixtures of two or more types thereof.

Examples of organic aluminum compounds include alkoxy compounds such as trimethoxyaluminum, triethoxyaluminum, isopropoxyaluminum, isopropoxydiethoxyaluminum, and tributoxyaluminum; acyloxy compounds such as triacetoxyaluminum, tristearate aluminum, and tributyrate aluminum; a chelate compounds such as aluminum isopropylate, aluminum sec-butyrate, aluminum tert-butyrate, aluminum tris(ethylacetoacetate), tris(hexafluoroacetylacetonate)aluminum, tris(ethylacetoacetate)aluminum, tris(n-propylacetoacetate)aluminum, tris(iso-propylacetoacetate) aluminum, tris(n-butylacetoacetate)aluminum, tris-salicylaldehyde aluminum, tris(2-ethoxycarbonylphenoate) aluminum, and tris(acetylacetonate)aluminum.

Examples of organic titanium compounds include tetraalkoxytitaniums such as tetraethoxytitanium, tetraisopropoxytitanium, and tetrabutyloxytitanium; tetraethylene glycol titanate, di-n-butyl-bis(triethanolamine) titanate, di-isopropoxytitanium bis(acetylacetonate), isopropoxytitanium octanate, isopropyltitanium trimethacrylate, isopropyltitanium triacrylate, isopropyl triisostearoyl titanate, isopropyl tridecylbenzene sulfonyl titanate, isopropyl tri(butyl, methylpyrophosphate)titanate, tetraisopropyl di(dilaurylphosphite)titanate, dimethacryloxy acetate titanate, diacryloxy acetate titanate, di(dioctylphosphate)ethylene titanate, isopropoxytitanium tri(dioctylphosphate), isopropyl tris(dioctylpyrophosphate)titanate, tetraisopropyl bis(dioctylphosphate)titanate, tetraoctyl bis(ditridecylphosphate) titanate, tetra(2,2-diallyloxymethyl-1-butyl)bis(di-tridecyl) phosphite titanate, bis(dioctylpyrophosphate)oxyacetate titanate, tris(dioctylpyrophosphate)ethylene titanate, isopropyl tri-n-dodecylbenzene sulfonyl titanate, isopropyl trioctanoyl titanate, isopropyl dimethacryloyl isostearoyl titanate, isopropyl isostearoyl diacryl titanate, isopropyl tri (dioctylphosphate)titanate, isopropyl tricumylphenyl titanate, and isopropyl tris(N-aminoethyl-aminoethyl)titanate.

Examples of organic zirconium compounds include zirconium n-propoxide, zirconium n-butoxide, zirconium t-butoxide, zirconium isopropoxide, zirconium ethoxide, zirconium acetate, zirconium acetylacetonate, zirconium butoxy acetylacetonate, zirconium bis-acetylacetonate, zirconium ethyl acetoacetate, zirconium acetylacetonate bis-ethyl acetoacetate, zirconium hexafluoroacetylacetonate, and zirconium trifluoroacetylacetonate.

Examples of organic magnesium compounds include ethyl acetoacetate magnesium monoisopropylate, megnesium bis(ethylacetoacetate), alkylacetoacetate magnesium monoisopropylate, and magnesium bis(acetylacetonate).

Examples of organic zinc compounds include zinc bis (ethylacetoacetate), zinc acetylacetonate, zinc bis-2-ethylhexanoate, zinc(meth)acrylate, zinc neodecanoate, zinc acetate, zinc octoate, and zinc salicylate.

Examples of organic copper compounds include copper bis(ethylacetoacetate) and copper bis(acetylacetonate).

Examples of organic nickel compounds include nickel bis(ethylacetoacetate) and nickel bis(acetylacetonate).

Examples of organic chromium compounds include chromium tris(ethylacetoacetate) and chromium tris(acetylacetonate).

Examples of organic cobalt compounds include cobalt tris(ethylacetoacetate) and cobalt tris(acetylacetonate).

Examples of organic iron compounds include iron tris (ethylacetoacetate) and iron tris(acetylacetonate). Examples of organic indium compounds include indium tris(ethylacetoacetate) and indium tris(acetylacetonate).

Examples of organic lanthanum compounds include lanthanum tris(ethylacetoacetate) and lanthanum tris(acetylacetonate).

Examples of organic tin compounds include tin tetrakis (ethylacetoacetate) and tin tetrakis(acetylacetonate).

Examples of organic hafnium compounds include hafnium n-butoxide, hafnium t-butoxide, hafnium ethoxide, hafnium isopropoxide, hafnium isopropoxide monoisopropylate, hafnium acetylacenate, and tetrakis(dimethylamino) hafnium.

In particular, component (G) is preferably at least one type of a metal-based condensation reaction catalyst selected from the group consisting of organic aluminum compounds, organic titanium compounds, organic zirconium compounds, organic zinc compounds, and organic iron compounds.

The content of component (G) is preferably an amount in the range of from 20 ppm to 0.1%, an amount in the range of from 30 ppm to 0.05%, or an amount in the range of from 50 ppm to 0.03% in terms of mass units with respect to the present composition. This is because when the content of component (G) is greater than or equal to the lower limit of the aforementioned range, peeling with respect to moisture absorption and reflow can be sufficiently suppressed, whereas when the content of component (G) is less than or equal to the upper limit of the aforementioned range, the storage stability of the obtained composition is improved.

In addition, the present composition may also contain an adhesion promoter in order to further improve adhesion to the substrate with which the composition makes contact during curing. This adhesion promoter is preferably an organic silicon compound having one or more silicon-bonded alkoxy groups per molecule. Examples of the alkoxy groups include methoxy groups, ethoxy groups, propoxy groups, butoxy groups, and methoxyethoxy groups, and methoxy groups or ethoxy groups are particularly preferable. Examples of groups other than alkoxy groups bonding with the silicon atoms of this organic silicon compound include the same substituted or unsubstituted monovalent hydrocarbon groups as those described above such as alkyl groups, alkenyl groups, aryl groups, aralkyl groups, and halogenated alkyl groups; glycidoxyalkyl groups such as 3-glycidoxypropyl groups and 4-glycidoxybutyl groups; epoxycyclohexylalkyl groups such as 2-(3,4-epoxycyclohexyl)ethyl groups and 3-(3,4-epoxycyclohexyl)propyl groups; oxyranylalkyl groups such as 4-oxyranylbutyl groups and 8-oxyranyloctyl groups; acrylic group-containing monovalent organic groups such as 3-methacryloxypropyl groups; isocyanate groups; isocyanurate groups; and hydrogen atoms. The organic silicon compound preferably has a group that can react with the aliphatic unsaturated hydrocarbon groups or silicon-bonded hydrogen atoms in the present composition. Specifically, the organic silicon compound preferably has silicon-bonded aliphatic unsaturated hydrocarbon groups or silicon-bonded hydrogen atoms.

The content of the adhesion promoter is not limited but is preferably in the range of from 0.01 to 10 parts by mass or in the range of from 0.1 to 3 parts by mass per 100 parts by mass of the present composition.

In addition, the present composition may also contain a fluorescent substance as an optional component. Examples of this fluorescent substance include yellow, red, green, and blue light emitting fluorescent substances including oxide fluorescent substances, oxynitride fluorescent substances, nitride fluorescent substances, sulfide fluorescent substances, oxysulfide fluorescent substances, or the like, which are widely used in light emitting diodes (LEDs), and mixtures of at least two types thereof. Examples of oxide fluorescent substances include yttrium, aluminum, and garnet-type YAG green to yellow light-emitting fluorescent substances containing cerium ions; terbium, aluminum, and garnet-type TAG yellow light-emitting fluorescent substances containing cerium ions; and silicate-type green to yellow light-emitting fluorescent substances containing cerium or europium ions. Examples of oxynitride fluorescent substances include silicon, aluminum, oxygen, and nitrogen-type SiAlON red to green light-emitting fluorescent substances containing europium ions. Examples of nitride fluorescent substances include calcium, strontium, aluminum, silicon, and nitrogen-type CASN red light-emitting fluorescent substances containing europium ions. Examples of sulfide fluorescent substances include ZnS green light-emitting fluorescent substances containing copper ions or aluminum ions. Examples of oxysulfide fluorescent substances include $Y_2O_2S$ red light-emitting fluorescent substances containing europium ions.

The content of the fluorescent substance is not particularly limited but is preferably in the range of from 0.1 to 70 mass % or in the range of from 1 to 20 mass % in the present composition.

In addition, the present composition may also contain one or more types of inorganic fillers selected from silica, glass, alumina, and the like; silicone rubber powders; resin powders such as silicone resins and polymethacrylate resins; and one or more types of components selected from heat resistant agents, dyes, pigments, flame retarder, surfactants, solvents, and the like as other optional components, as long as the object of the present invention is not undermined.

The present composition is such that curing occurs either when left to stand at room temperature or when heated, but it is preferable to heat the composition in order to achieve rapid curing. The heating temperature is preferably in the range of from 50 to 200° C.

The present composition preferably forms a cured product with a type A durometer hardness of from 15 to 99 or from 30 to 95 as prescribed by JIS K 6253 when cured. This is because when the hardness of the cured product of the curable silicone composition is greater than or equal to the lower limit of the aforementioned range, it is strong and demonstrates excellent protective performance when used as a sealing material or a covering material of an optical semiconductor element, whereas when the hardness is less than or equal to the upper limit of the aforementioned range, the cured product becomes flexible and the durability is excellent.

Next, the optical semiconductor device of the present invention will be described in detail.

The optical semiconductor device of the present invention is characterized in that an optical semiconductor element is sealed, covered or adhered with a cured product of the composition described above. Examples of the optical semiconductor element include light-emitting diodes (LEDs), semiconductor lasers, photodiodes, phototransistors, solid-state image sensing devices, and light emitters and receivers for photocouplers; and the optical semiconductor element is particularly preferably a light-emitting diode (LED).

Since light emission occurs from the top, bottom, left, and right sides of the optical semiconductor element in a light-emitting diode (LED), it is not preferable for the parts constituting the light-emitting diode (LED) to absorb light, and a material with high optical transmittance or high reflectivity is preferable. Therefore, it is also preferable for the substrate on which the optical semiconductor element is mounted to be a material with high optical transmittance or high reflectivity. Examples of the substrate upon which this optical semiconductor element is mounted include electrically conductive metals such as silver, gold, and copper; non-electrically conductive metals such as aluminum and nickel; thermoplastic resins such as PPA and LCP intermixed with white pigments; thermosetting resins such as epoxy resins, BT resins, polyimide resins, and silicone resins including white pigment; and ceramics such as alumina and aluminum nitride. The curable silicone composition has favorable thermal shock resistance with respect to the optical semiconductor element and the substrate, and the resulting optical semiconductor device can demonstrate good reliability.

FIG. 1 illustrates a cross-sectional view of a surface mounted type LED, which is one example of the optical semiconductor device of the present invention. In the LED illustrated in FIG. 1, the optical semiconductor element 1 is die-bonded to a lead frame 2, and this optical semiconductor element 1 is further wire-bonded to a lead frame 3 by a bonding wire 4. At the periphery of this optical semiconductor element 1, a light reflection material 5 is formed, and the optical semiconductor element 1 inside this light reflection material 5 is sealed by a cured product 6 of the curable silicone composition described above.

An example of a method of producing the surface mounted type LED illustrated in FIG. 1 is a method of die-bonding the optical semiconductor element 1 onto the lead frame 2 inside the light reflection material 5, wire-bonding the optical semiconductor element 1 and the lead frame 3 with a gold bonding wire 4, and then resin-sealing the optical semiconductor element 1 with the curable silicone composition described above.

EXAMPLES

The curable silicone composition and the optical semiconductor device of the present invention will be described in detail hereinafter using Practical Examples and Comparative Examples. The hardness of the cured product of the curable silicone composition was measured as follows.

[Hardness]

The curable silicone composition was press-molded under a pressure of 5 MPa for 5 minutes at 150° C. to produce a sheet-like cured product. The hardness of the sheet-like cured product was measured by a type A durometer as specified in JIS K 6253.

In addition, the optical semiconductor device illustrated in FIG. 1 was created by heating the curable silicone composition for 5 hours at 150° C. The sulfidation resistance and the peeling resistance of the curable silicone composition with respect to the optical semiconductor device were measured as follows by measuring the radiant flux of the optical semiconductor device.

[Sulfidation Resistance]

An initial radiant flux measurement was performed on the optical semiconductor device using a total radiant flux measurement apparatus utilizing integrating spheres, and the initial light extraction efficiency (%) was calculated. Next, this optical semiconductor device was placed in an autoclave with sodium sulfide hexahydrate, heated to 50° C., and was left to stand for two hours. A radiant flux measurement was then performed using a total radiant flux measurement apparatus utilizing integrating spheres, and the light extraction efficiency (%) after two hours was calculated.

[Initial Peeling Rate]

The peeling state between the lead frame or wire bonding and the heat-cured product of this composition was observed with an optical microscope for 20 optical semiconductor devices, and the ratio of peeling (number of peeled samples/20 samples) was defined as the peeling rate.

[Peeling Rate after Moisture Absorption and Reflow]

After 20 of the aforementioned optical semiconductor devices were stored for 168 hours in an oven at 85° C. and 85% RH and placed inside an oven at 280° C. for 30 seconds, the units were returned to room temperature (25° C.). The peeling state between the lead frame or wire bonding and the heat-cured product of this composition was observed with an optical microscope, and the ratio of peeling (number of peeled samples/20 samples) was defined as the peeling rate.

Practical Examples 1 to 8 and Comparative Examples 1 to 6

The following components were uniformly mixed according to the compositions (parts by mass) shown in Table 1 to prepare the curable silicone compositions of Practical Examples 1 to 8 and Comparative Examples 1 to 6. In the formulae, Vi represents a vinyl group, and Me represents a methyl group. Moreover, in Tables 1 and 2, "SiH/Vi" represents the total moles of silicon-bonded hydrogen atoms in component (B) per 1 mole of total vinyl groups in component (A) in the curable silicone composition.

The following components were used as component (A). Here, the viscosity was the value at 25° C. and was measured using a type B viscometer in accordance with JIS K 7117-1.

Component (a-1-1): a dimethylpolysiloxane capped at both molecular terminals with dimethylvinylsiloxy groups having a viscosity of 300 mPa·s and represented by the average formula:

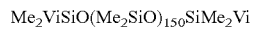

$$Me_2ViSiO(Me_2SiO)_{150}SiMe_2Vi$$

(vinyl group content=0.48 mass %)

Component (a-1-2): a dimethylpolysiloxane capped at both molecular terminals with dimethylvinylsiloxy groups having a viscosity of 10,000 mPa·s and represented by the average formula:

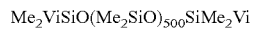

$$Me_2ViSiO(Me_2SiO)_{500}SiMe_2Vi$$

(vinyl group content=0.15 mass %)

Component (a-2-1): a white solid at 25° C. and toluene-soluble organopolysiloxane having two or more vinyl groups per molecule and represented by the average unit formula:

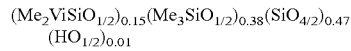

$$(Me_2ViSiO_{1/2})_{0.15}(Me_3SiO_{1/2})_{0.38}(SiO_{4/2})_{0.47}(HO_{1/2})_{0.01}$$

(vinyl group content=5.5 mass %; 9.4 mol %)

Component (a-2-2): a white solid at 25° C. and toluene-soluble organopolysiloxane having two or more vinyl groups per molecule and represented by the average unit formula:

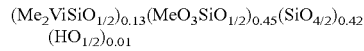

$$(Me_2ViSiO_{1/2})_{0.13}(MeO_3SiO_{1/2})_{0.45}(SiO_{4/2})_{0.42}(HO_{1/2})_{0.01}$$

(vinyl group content=4.7 mass %; 7.5 mol %)

The following components were used as component (B). The viscosity was the value at 25° C. and was measured using a type B viscometer in accordance with JIS K 7117-1.

Component (b-1): a polymethylhydrogensiloxane capped at both molecular terminals with trimethylsiloxy groups having a viscosity of 20 mPa·s and represented by the average formula:

$$Me_3SiO(MeHSiO)_{55}SiMe_3$$

(silicon-bonded hydrogen atom content=1.6 mass %)

Component (b-2): a dimethylsiloxane-methylhydrogensiloxane copolymer capped at both molecular terminals with trimethylsiloxy groups having a viscosity of 5 mPa·s and represented by the average formula:

$$Me_3SiO(MeHSiO)_{15}SiMe_3$$

(silicon-bonded hydrogen atom content=1.42 mass %)

The following components were used as component (C).
Component (c-1): 1H-tetrazole-1-acetic acid
Component (c-2): 1H-tetrazole-5-acetic acid
Component (c-3): 1,5-pentamethylenetetrazole
Component (c-4): 1H-tetrazole
Component (c-5): Benzoimidazole
Component (c-6): 2-mercaptobenzothiazole A 1,3-divinyltetramethyldisiloxane solution of a 1,3-divinyltetramethyldisiloxane complex of platinum (platinum metal content=approximately 6,000 ppm) was used as component (D).

1-Ethynylcyclohexan-1-ol was used as component (E).

A zinc oxide powder having a mass average particle size of 0.5 μm and being surface-coated with $SiO_2$ and a zinc oxide fine powder surface-treated with a dimethylsiloxane-methylhydrogensiloxane copolymer capped at both molecular terminals with trimethylsiloxy groups having a viscosity of 20 mPa·s were used as component (F).

Acetoalkoxyaluminum diisopropylate was used as component (G).

TABLE 1

| | | | Category | | | | | | | |
|---|---|---|---|---|---|---|---|---|---|---|
| | Item | | Practical Example 1 | Practical Example 2 | Practical Example 3 | Practical Example 4 | Practical Example 5 | Practical Example 6 | Practical Example 7 | Practical Example 8 |
| Composition of curable silicone composition (parts by mass) | Component (A) | Component (a-1-1) | 32 | 5 | 32 | 5 | 32 | 32 | 32 | 32 |
| | | Component (a-1-2) | 5 | 53 | 5 | 53 | 5 | 5 | 5 | 5 |
| | | Component (a-2-1) | — | 35 | — | 35 | — | — | — | — |
| | | Component (a-2-2) | 55 | — | 55 | — | 55 | 55 | 55 | 55 |
| | Component (B) | Component (b-1) | — | 7 | — | 7 | — | — | — | — |
| | | Component (b-2) | 8 | — | 8 | — | 8 | 8 | 8 | 8 |
| | Component (C) | Component (c-1) | 0.01 | — | — | — | 0.001 | 0.1 | 0.01 | 0.01 |
| | | Component (c-2) | — | 0.01 | — | — | — | — | — | — |
| | | Component (c-3) | — | — | 0.01 | — | — | — | — | — |
| | | Component (c-4) | — | — | — | 0.01 | — | — | — | — |
| | Component (D) | | 0.1 | 0.1 | 0.1 | 0.1 | 0.1 | 0.1 | 0.1 | 0.1 |
| | Component (E) | | 0.1 | 0.1 | 0.1 | 0.1 | 0.1 | 0.1 | 0.1 | 0.1 |
| | Component (F) | | — | — | — | — | — | — | 0.1 | — |
| | Component (G) | | — | — | — | — | — | — | — | 0.01 |
| | SiH/Vi | | 1.1 | 1.5 | 1.1 | 1.5 | 1.1 | 1.1 | 1.1 | 1.1 |
| | Hardness of the cured product | | 85 | 70 | 85 | 70 | 85 | 85 | 85 | 85 |
| Sulfidation resistance | Initial light extraction efficiency (%) | | 100 | 100 | 100 | 100 | 100 | 100 | 100 | 100 |
| | Light extraction efficiency (%) after two hours | | 97 | 97 | 96 | 97 | 93 | 98 | 99 | 97 |
| Peeling resistance | Initial peeling rate | | 0/20 | 0/20 | 0/20 | 0/20 | 0/20 | 0/20 | 0/20 | 0/20 |
| | Peeling rate after moisture absorption and reflow | | 20/20 | 20/20 | 20/20 | 20/20 | 20/20 | 20/20 | 20/20 | 0/20 |

TABLE 2

| | | | Category | | | | | |
|---|---|---|---|---|---|---|---|---|
| | Item | | Comparative Example 1 | Comparative Example 2 | Comparative Example 3 | Comparative Example 4 | Comparative Example 5 | Comparative Example 6 |
| Composition of curable silicone composition (parts by mass) | Component (A) | Component (a-1-1) | 32 | 5 | 32 | 5 | 32 | 5 |
| | | Component (a-1-2) | 5 | 53 | 5 | 53 | 5 | 53 |
| | | Component (a-2-1) | — | 35 | — | 35 | — | 35 |
| | | Component (a-2-2) | 55 | — | 55 | — | 55 | — |
| | Component (B) | Component (b-1) | — | 7 | — | 7 | — | 7 |
| | | Component (b-2) | 8 | — | 8 | — | 8 | — |
| | Component (C) | Component (c-5) | 0.01 | — | — | — | — | — |
| | | Component (c-6) | — | 0.01 | — | — | — | — |
| | Component (D) | | 0.1 | 0.1 | 0.1 | 0.1 | 0.1 | 0.1 |
| | Component (E) | | 0.1 | 0.1 | 0.1 | 0.1 | 0.1 | 0.1 |
| | Component (G) | | — | — | 0.01 | 0.01 | — | — |
| | SiH/Vi | | 1.1 | 1.5 | 1.1 | 1.5 | 1.1 | 1.5 |
| | Hardness of the cured product | | —* | —* | 85 | 70 | 85 | 70 |
| Sulfidation resistance | Initial light extraction efficiency (%) | | —* | —* | 100 | 100 | 100 | 100 |

TABLE 2-continued

| | | Category | | | | | |
|---|---|---|---|---|---|---|---|
| | Item | Comparative Example 1 | Comparative Example 2 | Comparative Example 3 | Comparative Example 4 | Comparative Example 5 | Comparative Example 6 |
| | Light extraction efficiency (%) after two hours | —* | —* | 88 | 88 | 88 | 88 |
| Peeling resistance | Initial peeling rate | —* | —* | 0/20 | 0/20 | 0/20 | 0/20 |
| | Peeling rate after moisture absorption and reflow | —* | —* | 20/20 | 20/20 | 20/20 | 20/20 |

*Measurement not possible due to failure to cure

It was demonstrated from Table 1 that the cured products of the curable silicone compositions of Practical Examples 1 to 8 have high sulfidation resistance.

INDUSTRIAL APPLICABILITY

The curable silicone composition of the present invention is useful as a sealing agent or adhesive for optical semiconductor elements such as light emitting diodes (LEDs), semiconductor lasers, photodiodes, phototransistors, solid-state image sensing device, light emitters and receivers for photocouplers, or the like. In addition, the optical semiconductor device of the present invention is useful as an optical semiconductor device such as an optical device, optical equipment, lighting equipment or a lighting device.

REFERENCE NUMERALS

1 Optical semiconductor element
2 Lead frame
3 Lead frame
4 Bonding wire
5 Reflective member
6 Cured product of the curable silicone composition

The invention claimed is:

1. A hydrosilylation curable silicone composition for sealing, covering, or adhering an optical semiconductor element, the curable silicone composition comprising:
   (A) an organopolysiloxane having at least two silicon-bonded alkenyl groups per molecule;
   (B) an organohydrogenpolysiloxane having at least two silicon-bonded hydrogen atoms per molecule, in an amount such that an amount of silicon-bonded hydrogen atoms in this component is from 0.1 to 10 mol per 1 mol of silicon-bonded alkenyl groups in component (A);
   (C) a tetrazole-based compound, in an amount of from 0.0001% to 0.5% with respect to the composition in terms of mass units; and
   (D) a hydrosilylation reaction catalyst, in an amount which accelerates the curing of the present composition.

2. The curable silicone composition according to claim 1, wherein component (A) is (A-1) a straight-chain organopolysiloxane represented by the general formula:

$R^1_3SiO(R^1_2SiO)_mSiR^1_3$ wherein $R^1$ are the same or different monovalent hydrocarbon groups; however, at least two $R^1$ in each molecule are alkenyl groups; and "m" is an integer of from 5 to 1,000;

and/or (A-2) a branched-chain organopolysiloxane represented by the average unit formula:

$(R^1SiO_{3/2})_a(R^1_2SiO_{2/2})_b(R^1_3SiO_{1/2})_c(SiO_{4/2})_d(XO_{1/2})_e$ wherein $R^1$ are the same as defined above; however, from 0.01 to 50 mol % of the total of $R^1$ are alkenyl groups; X is a hydrogen atom or an alkyl group; and "a", "b", "c", "d", and "e" are numbers satisfying: $0 \leq a \leq 1.0$, $0 \leq b \leq 1.0$, $0 \leq c < 0.9$, $0 \leq d < 0.5$, $0 \leq e < 0.4$, and $a+b+c+d=1.0$.

3. The curable silicone composition according to claim 2, wherein component (C) is at least one tetrazole-based compound selected from the group consisting of 1H-tetrazole, 1H-tetrazole-1-acetic acid, 1H-tetrazole-5-acetic acid, 1H-tetrazole-1-ethyl acetate, 1H-tetrazole-5-ethyl acetate, 1-methyl-1H-tetrazole, 1-ethyl-1H-tetrazole, 1-propyl-1H-tetrazole, 1-butyl-1H-tetrazole, 1-pentyl-1H-tetrazole, 1-phenyl-1H-tetrazole, 1,5-dimethyl-1H-tetrazole, 1-ethyl-5-methyl-1H-tetrazole, 1-phenyl-5-methyl-1H-tetrazole, 1-methyl-5-ethyl-1H-tetrazole, 1-methyl-5-phenyl-1H-tetrazole, 1-ethyl-5-phenyltetrazole, 1,5-diphenyl-1H-tetrazole, 1,5-trimethylene-1H-tetrazole, 1,5-tetramethylene-1H-tetrazole, 1,5-pentamethylene-1H-tetrazole, 5-methyl-1H-tetrazole, 5-ethyl-1H-tetrazole, 5-phenyl-1H-tetrazole, 5-benzyl-1H-tetrazole, 5-methoxy-1H-tetrazole, and 2H-tetrazole-2-acetic acid.

4. The curable silicone composition according to claim 1, wherein component (C) is at least one tetrazole-based compound selected from the group consisting of 1H-tetrazole, 1H-tetrazole-1-acetic acid, 1H-tetrazole-5-acetic acid, 1H-tetrazole-1-ethyl acetate, 1H-tetrazole-5-ethyl acetate, 1-methyl-1H-tetrazole, 1-ethyl-1H-tetrazole, 1-propyl-1H-tetrazole, 1-butyl-1H-tetrazole, 1-pentyl-1H-tetrazole, 1-phenyl-1H-tetrazole, 1,5-dimethyl-1H-tetrazole, 1-ethyl-5-methyl-1H-tetrazole, 1-phenyl-5-methyl-1H-tetrazole, 1-methyl-5-ethyl-1H-tetrazole, 1-methyl-5-phenyl-1H-tetrazole, 1-ethyl-5-phenyltetrazole, 1,5-diphenyl-1H-tetrazole, 1,5-trimethylene-1H-tetrazole, 1,5-tetramethylene-1H-tetrazole, 1,5-pentamethylene-1H-tetrazole, 5-methyl-1H-tetrazole, 5-ethyl-1H-tetrazole, 5-phenyl-1H-tetrazole, 5-benzyl-1H-tetrazole, 5-methoxy-1H-tetrazole, and 2H-tetrazole-2-acetic acid.

5. The curable silicone composition according to claim 1, further comprising (E) a hydrosilylation reaction suppressing agent in an amount of from 0.0001 to 5 parts by mass per total of 100 parts by mass of components (A) to (D).

6. The curable silicone composition according to claim 1, further comprising (F) zinc oxide or zinc carbonate in an amount of from 0.0001 to 10 parts by mass per total of 100 parts by mass of components (A) to (D).

7. The curable silicone composition according to claim 6, wherein component (F) is at least one fine powder having a mass average particle size of from 0.1 nm to 5 μm selected from the group consisting of zinc oxide fine powders surface-coated with an oxide and/or hydroxide of at least one element selected from the group consisting of Al, Ag, Cu, Fe, Sb, Si, Sn, Ti, Zr, and rare earth elements; zinc oxide fine powders surface-treated with organic silicon compounds not having alkenyl groups; and hydrate fine powders of zinc carbonate.

8. The curable silicone composition according to claim 7, wherein component (F) is a zinc oxide fine powder surface-treated with at least one organic silicon compound not having alkenyl groups selected from the group consisting of organosilanes, organosilazanes, organosiloxane oligomers, polymethylsiloxanes, and organohydrogenpolysiloxanes.

9. The curable silicone composition according to claim 6, wherein component (F) is a fine powder of a hydrate of zinc carbonate having a mass reduction rate of at least 0.1 mass % when heated for three hours at 105° C.

10. The curable silicone composition according to claim 1, further comprising (G) a metal-based condensation reaction catalyst in an amount of from 0.002 to 0.1 parts by mass per total of 100 parts by mass of components (A) to (D).

11. The curable silicone composition according to claim 10, wherein component (G) is at least one organic metal compound selected from the group consisting of organic aluminum compounds, organic titanium compounds, organic zirconium compounds, organic zinc compounds, and organic iron compounds.

12. The curable silicone composition according to claim 7, wherein component (F) is a fine powder of a hydrate of zinc carbonate having a mass reduction rate of at least 0.1 mass % when heated for three hours at 105° C.

13. An optical semiconductor device wherein an optical semiconductor element is sealed, covered, or adhered with the cured product of the curable silicone composition according to claim 1.

14. The optical semiconductor device according to claim 13, wherein the optical semiconductor element is a light emitting diode.

* * * * *